US011279825B2

(12) United States Patent
Joeng et al.

(10) Patent No.: US 11,279,825 B2
(45) Date of Patent: Mar. 22, 2022

(54) COMPOSITION FOR POLISHING PAD, POLISHING PAD AND PREPARATION METHOD THEREOF

(71) Applicant: SKC solmics Co., Ltd., Gyeonggi-do (KR)

(72) Inventors: Eun Sun Joeng, Ulsan (KR); Hye Young Heo, Gyeonggi-do (KR); Jang Won Seo, Busan (KR); Jong Wook Yun, Gyeonggi-do (KR)

(73) Assignee: SKC solmics Co., Ltd., Gyeonggi-do (KR)

( * ) Notice: Subject to any disclaimer, the term of this patent is extended or adjusted under 35 U.S.C. 154(b) by 166 days.

(21) Appl. No.: 16/726,725

(22) Filed: Dec. 24, 2019

(65) Prior Publication Data

US 2020/0207981 A1 Jul. 2, 2020

(30) Foreign Application Priority Data

Dec. 26, 2018 (KR) .................. 10-2018-0169552

(51) Int. Cl.
| | |
|---|---|
| *B24B 37/24* | (2012.01) |
| *B24B 37/26* | (2012.01) |
| *B24D 18/00* | (2006.01) |
| *C08G 18/10* | (2006.01) |
| *C08G 18/12* | (2006.01) |
| *C08G 18/32* | (2006.01) |
| *C08G 18/48* | (2006.01) |
| *C08G 18/66* | (2006.01) |
| *C08G 18/72* | (2006.01) |
| *C08G 18/75* | (2006.01) |
| *C08G 18/76* | (2006.01) |
| *C08J 9/00* | (2006.01) |
| *C08J 9/12* | (2006.01) |
| *C08J 9/14* | (2006.01) |
| *C08J 9/228* | (2006.01) |
| *C08J 9/32* | (2006.01) |
| *C08L 75/04* | (2006.01) |
| *H01L 21/306* | (2006.01) |
| *H01L 21/321* | (2006.01) |

(52) U.S. Cl.
CPC .............. *C08L 75/04* (2013.01); *B24B 37/24* (2013.01); *B24B 37/26* (2013.01); *C08G 18/10* (2013.01); *C08G 18/7621* (2013.01); *H01L 21/3212* (2013.01)

(58) Field of Classification Search
CPC ...................................... B24B 37/24
See application file for complete search history.

(56) References Cited

U.S. PATENT DOCUMENTS

| | | | | |
|---|---|---|---|---|
| 9,079,289 | B2* | 7/2015 | Sato ................... | C08G 18/3206 |
| 9,126,303 | B2* | 9/2015 | Hirose ............... | C08G 18/4854 |
| 9,457,452 | B2* | 10/2016 | Nakai .................. | B24B 37/24 |
| 2008/0153395 | A1* | 6/2008 | Kulp ..................... | B24D 3/26 |
| | | | | 451/41 |
| 2009/0093201 | A1* | 4/2009 | Kazuno .................... | C08J 9/30 |
| | | | | 451/533 |
| 2009/0093202 | A1* | 4/2009 | Fukuda ................. | B24B 37/205 |
| | | | | 451/533 |
| 2014/0065932 | A1* | 3/2014 | Kazuno .................. | C09J 163/00 |
| | | | | 451/59 |

FOREIGN PATENT DOCUMENTS

| | | | | |
|---|---|---|---|---|
| CN | 100384902 C | 4/2008 | | |
| JP | 2006-320980 A | 11/2006 | | |
| JP | 2007-061928 A | 3/2007 | | |
| JP | 2007-061929 A | 3/2007 | | |
| JP | 2012-000745 A | 1/2012 | | |
| JP | 2020204028 A | * 12/2020 | ....... | H01L 21/30625 |
| KR | 10-1061145 | 8/2011 | | |
| KR | 10-2016-0027075 | 3/2016 | | |
| KR | 20210002429 A | * 1/2020 | | |
| TW | 200902228 A | 1/2009 | | |

OTHER PUBLICATIONS

Office Action issued by Japanese Patent Office dated Oct. 13, 2020.
Office Action issued by Taiwan Patent Office dated Aug. 4, 2020.
Office Action issued by Korean Intellectual Property Office dated May 15, 2020.

* cited by examiner

*Primary Examiner* — Melissa A Rioja
(74) *Attorney, Agent, or Firm* — IP & T Group LLP (57) ABSTRACT

In the composition according to the embodiment, the composition of oligomers that constitute the chains in a urethane-based prepolymer may be adjusted to control the physical properties thereof such as gelation time. Thus, since the micropore characteristics, polishing rate, and pad cut rate of a polishing pad obtained by curing the composition according to the embodiment may be controlled, it is possible to efficiently manufacture high-quality semiconductor devices using the polishing pad.

13 Claims, 5 Drawing Sheets

COMPOSITION FOR POLISHING PAD, POLISHING PAD AND PREPARATION METHOD THEREOF

The present application claims priority of Korean patent application number 10-2018-0169552 filed on Dec. 26, 2018, which is incorporated herein by reference in its entirety.

TECHNICAL FIELD

Embodiments relate to a composition for a porous polyurethane polishing pad for use in a chemical mechanical planarization (CMP) process, a porous polyurethane polishing pad, and processes for preparing the same.

BACKGROUND ART

The chemical mechanical planarization (CMP) process in a process for preparing semiconductors refers to a step in which a semiconductor substrate such as a wafer is fixed to a head and in contact with the surface of a polishing pad mounted on a platen, and the wafer is then chemically treated by supplying a slurry while the platen and the head are relatively moved, to thereby mechanically planarize the irregularities on the semiconductor substrate.

A polishing pad is an essential member that plays an important role in such a CMP process. In general, a polishing pad is composed of a polyurethane resin, which comprises a prepolymer obtained by reacting a diisocyanate monomer and a polyol, a curing agent, a foaming agent, and the like.

In addition, a polishing pad is provided on its surface with grooves for a large flow of a slurry and pores for supporting a fine flow thereof. The pores may be formed by using a solid phase foaming agent having voids, an inert gas, a liquid phase material, a fiber, or the like, or by generating a gas by a chemical reaction (see Korean Laid-open Patent Publication No. 2016-0027075).

DISCLOSURE OF INVENTION

Technical Problem

A urethane-based prepolymer used in the preparation of a polishing pad varies in its physical properties with the monomers, which has a huge impact on the performance of the chemical mechanical planarization (CMP) process. Thus, it is very important to adjust the composition and physical properties of a urethane-based prepolymer in controlling the performance of a polishing pad.

As a result of the research conducted by the present inventors, it was found that the gelation time is changed by the composition of oligomers that constitute the chains in a urethane-based prepolymer, which then changes the elongation and pore size of the polishing pad, thereby affecting the CMP performance such as polishing rate thereof. In particular, the present inventors have focused on the composition of oligomers produced by the reaction of polyols with aromatic diisocyanate monomers used in the preparation of a urethane-based prepolymer.

Accordingly, the embodiments aim to provide a composition whose physical properties are controlled by adjusting the composition of oligomers that constitute the chains in a urethane-based prepolymer, a process for preparing the composition, a process for preparing a polishing pad therefrom, a polishing pad prepared from the composition, and a process for preparing a semiconductor by using the polishing pad.

Solution to Problem

According to one embodiment, there is provided a composition, which comprises a urethane-based prepolymer, a curing agent, and a foaming agent, wherein the urethane-based prepolymer comprises a first oligomer represented by the following Formula 1 in which n is 0 or 1; and a second oligomer represented by the following Formula 1 in which n is 2 or 3.

[Formula 1]

According to another embodiment, there is provided a process for preparing a composition, which comprises preparing a first oligomer represented by the above Formula 1 in which n is 0 or 1; preparing a second oligomer represented by the above Formula 1 in which n is 2 or 3; preparing a urethane-based prepolymer comprising the first oligomer and the second oligomer; and mixing the urethane-based prepolymer, a curing agent, and a foaming agent.

According to still another embodiment, there is provided a process for preparing a polishing pad, which comprises injecting the composition according to the previous embodiment into a mold and curing it.

According to still another embodiment, there is provided a polishing pad, which comprises a polyurethane resin and a plurality of micropores dispersed in the polyurethane resin, wherein the polyurethane resin is derived from a urethane-based prepolymer, and the urethane-based prepolymer has the same constitution as that of the urethane-based prepolymer contained in the composition according to the previous embodiment.

According to still another embodiment, there is provided a process for preparing a semiconductor device, which comprises polishing the surface of a semiconductor substrate using the polishing pad according to the previous embodiment.

Advantageous Effects of Invention

In the composition according to the embodiment, the composition of oligomers that constitute the chains in a urethane-based prepolymer may be adjusted to control the physical properties thereof such as gelation time. Thus, since the micropore characteristics, polishing rate, and pad cut rate of a polishing pad obtained by curing the composition according to the embodiment may be controlled, it is possible to efficiently manufacture high-quality semiconductor devices using the polishing pad.

BEST MODE FOR CARRYING OUT THE INVENTION

Throughout the description of the embodiments, in the case where an element is mentioned to be formed on or under another element, it means not only that the element is directly formed on or under another element, but also that the element is indirectly formed on or under another element with other element(s) interposed between them.

In this specification, when a part is referred to as "comprising" an element, it is to be understood that it may comprise other elements as well, rather than excluding the other elements, unless specifically stated otherwise.

In addition, all numerical ranges related to the physical properties, dimensions, and the like of a component used herein are to be understood as being modified by the term "about," unless otherwise indicated.

In this specification, singular forms are to be interpreted in the context of the singular or plural forms, unless the context describes otherwise.

Composition for a Polishing Pad

The composition according to one embodiment comprises a urethane-based prepolymer, a curing agent, and a foaming agent. Hereinafter, each component will be described in detail.

Urethane-Based Prepolymer

A prepolymer generally refers to a polymer having a relatively low molecular weight wherein the degree of polymerization is adjusted to an intermediate level for the sake of conveniently molding a product in the process of producing the same. For example, the weight average molecular weight (Mw) of the urethane-based prepolymer may be 500 g/mole to 3,000 g/mole, 600 g/mole to 2,000 g/mole, or 700 g/mole to 1,500 g/mole. A prepolymer may be molded by itself, or after a further reaction with another polymerizable compound or a curing agent, to form a final product.

The urethane-based prepolymer is a prepolymerization reaction product of at least one diisocyanate monomer and at least one polyol.

The at least one diisocyanate monomer may be at least one aromatic diisocyanate monomer and/or at least one aliphatic diisocyanate monomer. For example, it may be at least one isocyanate selected from the group consisting of toluene diisocyanate (TDI), naphthalene-1,5-diisocyanate, p-phenylene diisocyanate, tolidine diisocyanate, diphenyl methane diisocyanate (MDI), hexamethylene diisocyanate (HDI), dicyclohexylmethane diisocyanate (H12MDI), and isophorone diisocyanate.

As a specific example, the at least one diisocyanate monomer may comprise at least one aromatic diisocyanate monomer, and the at least one aromatic diisocyanate monomer may comprise toluene 2,4-diisocyanate and toluene 2,6-diisocyanate.

As another specific example, the at least one diisocyanate monomer may comprise at least one aliphatic diisocyanate monomer, and the at least one aliphatic diisocyanate monomer may be diphenylmethane diisocyanate (MDI), hexamethylene diisocyanate (HDI), dicyclohexylmethane diisocyanate (H12MDI), or the like.

The polyol used in the above embodiments is a conventional polyol widely recognized in the field of polyurethane preparation. It may have one, two, or more hydroxyl groups and is not particularly limited in terms of the kind and molecular weight. In general, a polyol is distinguished from a monomolecular alcohol. It may refer to a compound that comprises at least one hydroxyl group and has a certain molecular weight, for example, a weight average molecular weight of 200 or more, specifically 300 to 3,000.

Specific examples of the polyol include polyether polyols, polyester polyols, polycarbonate polyols, polycaprolactone polyols, and the like. The polymeric polyol may have a weight average molecular weight (Mw) of 300 g/mole to 3,000 g/mole. Specifically, a polyether polyol is a compound that contains two or more alkylene ether (or alkylene glycol) repeat units. It may have a molecular weight that reaches not only a low molecule but also an oligomer to a polymer depending on the number of repeats of the alkylene ether units.

In addition, a polyol may refer to a composition of a mixture of these compounds of various molecular weights. It may comprise such an alcohol as ethylene glycol (EG), diethylene glycol (DEG), propylene glycol (PG), propanediol (PDO), methyl propanediol (MP-diol), and the like.

Chain Configuration in the Prepolymer

The urethane-based prepolymer comprises polymerization reactants of various molecular weights between a diisocyanate monomer and a polyol.

Specifically, the urethane-based prepolymer comprises oligomers of various molecular weights between an aromatic diisocyanate monomer and a polyol.

More specifically, the urethane-based prepolymer comprises oligomers of various molecular weights between toluene diisocyanate (TDI) and diethylene glycol (DEG).

The urethane-based prepolymer according to the embodiment comprises a first oligomer represented by the following Formula 1 in which n is 0 or 1; and a second oligomer represented by the following Formula 1 in which n is 2 or 3.

[Formula 1]

For example, the urethane-based prepolymer may comprise the first oligomer and the second oligomer at a weight ratio of 1:0.1 to 1:10, 1:0.2 to 1:5, 1:0.5 to 1:2, or 1:0.6 to 1:1.5.

As a specific example, the urethane-based prepolymer may comprise the first oligomer and the second oligomer at a weight ratio of 1:0.2 to 1:5.

In addition, the urethane-based prepolymer may further comprise a third oligomer represented by the above Formula 1 in which n is an integer of 4 to 6.

For example, the urethane-based prepolymer may comprise the first oligomer, the second oligomer, and the third oligomer at a weight ratio of 1:0.1:0.1 to 1:10:10, 1:0.2:0.2 to 1:5:5, 1:0.5:0.5 to 1:2:2, or 1:0.6:0.6 to 1:1.5:1.5.

As a specific example, the urethane-based prepolymer may comprise the first oligomer, the second oligomer, and the third oligomer at a weight ratio of 1:0.2:0.1 to 1:5:10.

The first oligomer may be an oligomer represented by the above Formula 1 in which n is 0, an oligomer represented by the above Formula 1 in which n is 1, or a mixture thereof.

The second oligomer may be an oligomer represented by the above Formula 1 in which n is 2, an oligomer represented by the above Formula 1 in which n is 3, or a mixture thereof.

The third oligomer may be an oligomer represented by the above Formula 1 in which n is 4, an oligomer represented by the above Formula 1 in which n is 5, an oligomer represented by the above Formula 1 in which n is 6, or a mixture of at least two thereof.

Thus, the composition that comprises the first oligomer, the second oligomer, and the third oligomer may have various compositions.

As an example, the composition may comprise at least one of an oligomer represented by the above Formula 1 in which n is 0 and an oligomer represented by the above Formula 1 in which n is 1; and at least one of an oligomer represented by the above Formula 1 in which n is 2 and an oligomer represented by the above Formula 1 in which n is 3.

As another example, the composition may comprise at least one of an oligomer represented by the above Formula 1 in which n is 0 and an oligomer represented by the above Formula 1 in which n is 1; at least one of an oligomer represented by the above Formula 1 in which n is 2 and an oligomer represented by the above Formula 1 in which n is 3, and at least one of an oligomer represented by the above Formula 1 in which n is 4, an oligomer represented by the above Formula 1 in which n is 5, and an oligomer represented by the above Formula 1 in which n is 6.

As still another example, the composition may comprise an oligomer represented by the above Formula 1 in which n is 0, an oligomer represented by the above Formula 1 in which n is 1, and an oligomer represented by the above Formula 1 in which n is 2.

As still another example, the composition may comprise an oligomer represented by the above Formula 1 in which n is 0, an oligomer represented by the above Formula 1 in which n is 1, an oligomer represented by the above Formula 1 in which n is 2, and an oligomer represented by the above Formula 1 in which n is 3.

As still another example, the composition may comprise an oligomer represented by the above Formula 1 in which n is 0, an oligomer represented by the above Formula 1 in which n is 1, an oligomer represented by the above Formula 1 in which n is 2, an oligomer represented by the above Formula 1 in which n is 3, and an oligomer represented by the above Formula 1 in which n is 4.

As still another example, the composition may comprise an oligomer represented by the above Formula 1 in which n is 0, an oligomer represented by the above Formula 1 in which n is 1, an oligomer represented by the above Formula 1 in which n is 2, an oligomer represented by the above Formula 1 in which n is 3, an oligomer represented by the above Formula 1 in which n is 4, and an oligomer represented by the above Formula 1 in which n is 5.

As still another example, the composition may comprise an oligomer represented by the above Formula 1 in which n is 0, an oligomer represented by the above Formula 1 in which n is 1, an oligomer represented by the above Formula 1 in which n is 2, an oligomer represented by the above Formula 1 in which n is 3, an oligomer represented by the above Formula 1 in which n is 4, an oligomer represented by the above Formula 1 in which n is 5, and an oligomer represented by the above Formula 1 in which n is 6.

The urethane-based prepolymer contained in the composition according to the embodiment may further comprise a compound represented by the following Formula 2.

[Formula 2]

In the above formula, p is an integer of 5 to 30.

Alternatively, p may be an integer of 1 to 100, 3 to 50, or 10 to 20.

Reacted Diisocyanate Monomer

In the urethane-based prepolymer, the diisocyanate monomer may form a chain in the prepolymer by a reaction of at least one NCO group (i.e., a reaction of two NCO groups or one NCO group).

The reaction of the NCO group in the diisocyanate monomer includes a reaction with a polyol or a side reaction with another compound, and it is not specifically limited. For example, the reaction of the NCO group may include a chain extension reaction or a crosslinking reaction.

As an example, the reaction of the NCO group includes a urethane reaction in which the NCO group and the OH group are reacted to form a urethane group (—NH—C(=O)—

O—) in the course of reacting a diisocyanate monomer and a polyol to prepare the urethane-based prepolymer. As a representative example, the NCO group of toluene diisocyanate (TDI) and the OH group of diethylene glycol (DEG) may be subjected to a urethane reaction to form a polymer chain. As another example, the reaction of the NCO group may include a urea reaction with an amine compound and, as a result, form a urea group (—NH—C(=O)—NH—). As another example, the reaction of the NCO group may further include a crosslinking reaction. For example, it may further include a crosslinking reaction to form an allophanate group or a biuret group.

In particular, the at least one diisocyanate monomer used in the preparation of the urethane-based prepolymer may comprise at least one aromatic diisocyanate monomer. Such at least one aromatic diisocyanate monomer may participate in the prepolymerization reaction at a high rate.

For example, the urethane-based prepolymer may comprise an aromatic diisocyanate monomer in which at least one NCO group is reacted in an amount of 50% by weight to 99% by weight, 60% by weight to 99% by weight, 70% by weight to 99% by weight, 80% by weight to 99% by weight, or 90% by weight to 99% by weight, based on the total weight of the at least one aromatic diisocyanate monomer.

In particular, the urethane-based prepolymer may comprise an aromatic diisocyanate monomer in which two NCO groups are reacted in an amount of 10% by weight to 40% by weight, 10% by weight to 35% by weight, 15% by weight to 35% by weight, 20% by weight to 35% by weight, 10% by weight to 30% by weight, 20% by weight to 30% by weight, 15% by weight to 25% by weight, or 10% by weight to 25% by weight, based on the total weight of the at least one aromatic diisocyanate monomer.

In addition, the urethane-based prepolymer may comprise an aromatic diisocyanate monomer in which one NCO group is reacted in an amount of 50% by weight to 90% by weight, 60% by weight to 90% by weight, 70% by weight to 90% by weight, 80% by weight to 90% by weight, 50% by weight to 80% by weight, or 60% by weight to 80% by weight, based on the total weight of the at least one aromatic diisocyanate monomer.

In such event, the urethane-based prepolymer may comprise the aromatic diisocyanate monomer in which two NCO groups are reacted and the aromatic diisocyanate monomer in which one NCO group is reacted at a weight ratio of 0.1:1 to 1:1, 0.2:1 to 1:1, 0.2:1 to 0.5:1, 0.3:1 to 1:1, or 0.3:1 to 0.5:1.

More specifically, the at least one aromatic diisocyanate monomer may comprise toluene 2,4-diisocyanate and toluene 2,6-diisocyanate. In such event, the urethane-based prepolymer may comprise toluene 2,4-diisocyanate in which at least one NCO group is reacted and toluene 2,6-diisocyanate in which at least one NCO group is reacted in an amount of 90% by weight to 98% by weight, 93% by weight to 98% by weight, or 95% by weight to 98% by weight, based on the total weight of the at least one aromatic diisocyanate monomer.

In addition, the urethane-based prepolymer may comprise toluene 2,4-diisocyanate in which two NCO groups are reacted in an amount of 10% by weight to 40% by weight, 10% by weight to 35% by weight, 15% by weight to 35% by weight, 20% by weight to 35% by weight, 10% by weight to 30% by weight, 20% by weight to 30% by weight, or 10% by weight to 25% by weight, based on the total weight of the at least one aromatic diisocyanate monomer.

In addition, the urethane-based prepolymer may comprise toluene 2,4-diisocyanate in which one NCO group is reacted in an amount of 40% by weight to 80% by weight, 45% by weight to 75% by weight, 45% by weight to 70% by weight, 50% by weight to 65% by weight, 45% by weight to 65% by weight, 45% by weight to 60% by weight, 60% by weight to 75% by weight, or 60% by weight to 70% by weight, based on the total weight of the at least one aromatic diisocyanate monomer.

In addition, the urethane-based prepolymer may comprise toluene 2,6-diisocyanate in which one NCO group is reacted in an amount of 1% by weight to 30% by weight, 5% by weight to 25% by weight, 10% by weight to 25% by weight, 10% by weight to 20% by weight, 5% by weight to 20% by weight, 5% by weight to 15% by weight, or 10% by weight to 15% by weight, based on the total weight of the at least one aromatic diisocyanate monomer.

Unreacted Diisocyanate Monomer

In addition, some of the compounds used in the reaction for preparing the urethane-based prepolymer may not participate in the reaction.

Thus, a compound that has not participated in the reaction may be present in the urethane-based prepolymer.

Specifically, the urethane-based prepolymer may comprise an unreacted diisocyanate monomer. In this specification, the "unreacted diisocyanate monomer" refers to a diisocyanate monomer in which both of the two NCO groups remain unreacted.

The urethane-based prepolymer may comprise an unreacted diisocyanate monomer in an amount of 7% by weight to 10% by weight, 7% by weight to 9% by weight, 7% by weight to 8% by weight, 8% by weight to 10% by weight, 9% by weight to 10% by weight, or 8% by weight to 9% by weight, based on the weight of the urethane-based prepolymer.

The unreacted diisocyanate monomer present in the urethane-based prepolymer may comprise an unreacted aromatic diisocyanate monomer.

For example, the urethane-based prepolymer may comprise an unreacted aromatic diisocyanate monomer in an amount of 0.1% by weight to 5% by weight, 0.1% by weight to 3% by weight, 0.1% by weight to 2.3% by weight, 0.1% by weight to 1.5% by weight, 0.1% by weight to 1% by weight, 0.5% by weight to 2% by weight, or 1% by weight to 2% by weight, based on the weight of the urethane-based prepolymer.

As a specific example, the urethane-based prepolymer may comprise an unreacted aromatic diisocyanate monomer in an amount of 0.1% by weight to 3% by weight based on the weight of the urethane-based prepolymer.

When the at least one aromatic diisocyanate monomer used in the reaction for preparing the urethane-based prepolymer comprises toluene 2,4-diisocyanate and toluene 2,6-diisocyanate, toluene 2,6-diisocyanate among them is relatively low in reactivity and thus may be present in the urethane-based prepolymer without reacting with a polyol.

For example, the urethane-based prepolymer may comprise unreacted toluene 2,6-diisocyanate in an amount of 0.1% by weight to 10% by weight, 0.1% by weight to 8% by weight, 0.1% by weight to 6% by weight, 0.1% by weight to 4% by weight, 0.1% by weight to 3% by weight, 0.5% by weight to 4% by weight, or 1% by weight to 4% by weight, based on the weight of the urethane-based prepolymer.

In addition, the unreacted diisocyanate monomer present in the urethane-based prepolymer may comprise an unreacted aliphatic diisocyanate monomer.

For example, the urethane-based prepolymer may comprise an unreacted aliphatic diisocyanate monomer in an amount of 1% by weight to 20% by weight, 1% by weight to 15% by weight, 1% by weight to 10% by weight, 5% by weight to 20% by weight, 10% by weight to 20% by weight, or 5% by weight to 15% by weight, based on the weight of the urethane-based prepolymer.

In addition, the urethane-based prepolymer may comprise the unreacted aromatic diisocyanate monomer and the unreacted aliphatic diisocyanate monomer at a weight ratio of 0.01:1 to 1:1, 0.05:1 to 0.8:1, 0.05:1 to 0.7:1, 0.05:1 to 0.5:1, or 0.05:1 to 0.3:1.

Content of Unreacted NCO Group

The urethane-based prepolymer may have an unreacted NCO group at the terminal of a polymer, oligomer, or monomer contained therein.

For example, the urethane-based prepolymer may comprise an unreacted NCO group in an amount of 5% by weight to 15% by weight, 5% by weight to 13% by weight, 8% by weight to 10% by weight, 9% by weight to 10% by weight, 7% by weight to 9% by weight, or 7% by weight to 8% by weight, based on the weight of the urethane-based prepolymer.

As a specific example, the urethane-based prepolymer may comprise an unreacted NCO group in an amount of 7% by weight to 10% by weight based on the weight of the urethane-based prepolymer. In such event, the urethane-based prepolymer may comprise the unreacted aromatic diisocyanate monomer in an amount of 1% by weight to 3% by weight based on the weight of the urethane-based prepolymer. In addition, in such event, the composition may have a gelation time of 100 seconds to 115 seconds.

Curing Agent

The curing agent may be at least one of an amine compound and an alcohol compound. Specifically, the curing agent may comprise at least one compound selected from the group consisting of an aromatic amine, an aliphatic amine, an aromatic alcohol, and an aliphatic alcohol.

For example, the curing agent may be at least one selected from the group consisting of 4,4'-methylenebis(2-chloroaniline) (MOCA), diethyltoluenediamine (DETDA), diaminodiphenylmethane, diaminodiphenyl sulphone, m-xylylenediamine, isophoronediamine, ethylenediamine, diethylenetriamine, triethylenetetramine, polypropylenediamine, polypropylenetriamine, ethylene glycol, diethylene glycol, dipropylene glycol, butanediol, hexanediol, glycerin, trimethylolpropane, and bis(4-amino-3-chlorophenyl)methane.

The urethane-based prepolymer and the curing agent may be mixed at a molar equivalent ratio of 1:0.8 to 1:1.2, or a molar equivalent ratio of 1:0.9 to 1:1.1, based on the number of moles of the reactive groups in each molecule. Here, "the number of moles of the reactive groups in each molecule" refers to, for example, the number of moles of the isocyanate group in the urethane-based prepolymer and the number of moles of the reactive groups (e.g., amine group, alcohol group, and the like) in the curing agent. Therefore, the urethane-based prepolymer and the curing agent may be fed at a constant rate during the mixing process by controlling the feeding rate such that the urethane-based prepolymer and the curing agent are fed in amounts per unit time that satisfies the molar equivalent ratio exemplified above.

Foaming Agent

The foaming agent is not particularly limited as long as it is commonly used for forming voids in a polishing pad.

For example, the foaming agent may be at least one selected from a solid phase foaming agent having a void structure, a liquid phase foaming agent using a volatile liquid, and an inert gas.

The solid phase foaming agent may be microcapsules (hereinafter, referred to as "thermally expanded microcapsules"), whose size has been adjusted by a thermal expansion. The thermally expanded microcapsules may be obtained by thermally expanding thermally expandable microcapsules. Since the thermally expanded microcapsules in a structure of already expanded micro-balloons have a uniform particle diameter, they have the advantage that the diameter of pores can be uniformly controlled. Specifically, the solid phase foaming agent may be in a structure of micro-balloons having an average particle diameter of 5 μm to 200 μm.

The thermally expandable microcapsule may comprise a shell comprising a thermoplastic resin; and a foaming agent encapsulated inside the shell. The thermoplastic resin may be at least one selected from the group consisting of a vinylidene chloride-based copolymer, an acrylonitrile-based copolymer, a methacrylonitrile-based copolymer, and an acrylic-based copolymer. Furthermore, the foaming agent may be at least one selected from the group consisting of hydrocarbons having 1 to 7 carbon atoms.

The solid phase foaming agent may be employed in an amount of 0.1 part by weight to 2 parts by weight based on 100 parts by weight of the urethane-based prepolymer. Specifically, the solid phase foaming agent may be employed in an amount of 0.3 parts by weight to 1.5 parts by weight or 0.5 parts by weight to 1.0 parts by weight, based on 100 parts by weight of the urethane-based prepolymer.

The kind of the inert gas is not particularly limited as long as it is a gas that does not participate in the reaction between the urethane-based prepolymer and the curing agent. For example, the inert gas may be at least one selected from the group consisting of nitrogen gas ($N_2$), carbon dioxide ($CO_2$), argon gas (Ar), and helium (He). Specifically, the inert gas may be nitrogen gas ($N_2$) or carbon dioxide ($CO_2$).

The inert gas may be fed in a volume of 10% to 30% based on the total volume of the polyurethane composition. Specifically, the inert gas may be fed in a volume of 15% to 30% based on the total volume of the polyurethane composition.

Gelation Time

The composition takes a certain time to gelate by curing, which is referred to as gelation time.

The gelation time of the composition may be at least 50 seconds, at least 70 seconds, at least 80 seconds, or at least 100 seconds. For example, the gelation time of the composition may be 50 seconds to 200 seconds, 50 seconds to 150 seconds, 50 seconds to 100 seconds, 100 seconds to 200 seconds, or 150 seconds to 200 seconds. As a specific example, the composition may have a gelation time of 80 seconds to 130 seconds.

The gelation time may be, for example, a value measured at 70° C.

Characteristics Upon Gelation

The mechanical properties of the composition such as tensile strength, elongation, hardness, and the like may be adjusted to specific ranges upon curing.

For example, the tensile strength of the composition upon curing may be 5 N/mm$^2$ to 30 N/mm$^2$, 10 N/mm$^2$ to 25 N/mm$^2$, 10 N/mm$^2$ to 20 N/mm$^2$, or 15 N/mm$^2$ to 30 N/mm$^2$.

In addition, the elongation of the composition upon curing may be 50% to 300%, 100% to 300%, 150% to 250%, or 100% to 200%.

In addition, the hardness of the composition upon curing may be 30 Shore D to 80 Shore D, 40 Shore D to 70 Shore D, 50 Shore D to 70 Shore D, 40 Shore D to 60 Shore D, or 50 Shore D to 60 Shore D.

As a specific example, the composition upon curing may have a tensile strength of 10 N/mm$^2$ to 23 N/mm$^2$, an elongation of 80% to 250%, and a hardness of 40 Shore D to 65 Shore D.

The composition may have a plurality of micropores upon curing.

The average size of the micropores may be 10 μm to 50 μm, 20 μm to 50 μm, 20 μm to 40 μm, 20 μm to 30 μm, or 30 μm to 50 μm.

In addition, the polishing rate (or removal rate) of the composition upon curing may be 3,000 Å/50 seconds to 5,000 Å/50 seconds, 3,000 Å/50 seconds to 4,000 Å/50 seconds, 4,000 Å/50 seconds to 5,000 Å/50 seconds, or 3,500 Å/50 seconds to 4,500 Å/50 seconds.

The step of preparing a urethane-based prepolymer comprising the first oligomer and the second oligomer may be carried out simultaneously with, or sequentially to, the steps of preparing the first oligomer and preparing the second oligomer. Alternatively, the first oligomer and the second oligomer may be prepared first and then mixed with each other to obtain the urethane-based prepolymer.

Thereafter, the urethane-based prepolymer may be mixed with a curing agent and a foaming agent to obtain a composition.

For example, the urethane-based prepolymer, a curing agent, a foaming agent, and additives may be mixed first in a stirrer, followed by addition of a photoinitiator. In such event, the mixing may be carried out at a speed of 1,000 rpm to 10,000 rpm or 4,000 rpm to 7,000 rpm.

Process for Preparing a Polishing Pad

The process for preparing a polishing pad according to one embodiment comprises molding the composition according to the embodiment while curing it.

That is, the process for preparing a polishing pad according to one embodiment comprises preparing a first raw material composition comprising a urethane-based prepolymer; preparing a second raw material composition comprising a curing agent; preparing a third raw material composition comprising a foaming agent; sequentially or simultaneously mixing the first raw material composition with the second raw material composition and the third raw material composition to prepare a raw material mixture; and injecting the raw material mixture into a mold and curing it, wherein the urethane-based prepolymer comprises a first oligomer represented by the following Formula 1 in which n is 0 or 1; and a second oligomer represented by the following Formula 1 in which n is 2 or 3.

[Formula 1]

In addition, the pad cut rate of the composition upon curing may be 30 μm/hr to 60 m/hr, 30 μm/hr to 50 μm/hr, 40 μm/hr to 60 μm/hr, or 40 μm/hr to 50 μm/hr.

Process for Preparing a Composition

The process for preparing a composition according to one embodiment comprises preparing a first oligomer represented by the above Formula 1 in which n is 0 or 1; preparing a second oligomer represented by the above Formula 1 in which n is 2 or 3; preparing a urethane-based prepolymer comprising the first oligomer and the second oligomer; and mixing the urethane-based prepolymer, a curing agent, and a foaming agent.

The steps of preparing the first oligomer and preparing the second oligomer are carried out by reacting at least one diisocyanate monomer and at least one polyol. The first oligomer and the second oligomer may be obtained by adjusting such reaction conditions as reaction equivalent ratio, reaction time, and the like. Alternatively, a prepolymer having oligomers of various molecular weights may be prepared and then purified to obtain the first oligomer and the second oligomer.

Specifically, the step of preparing the raw material mixture may be carried out by mixing the first raw material composition with the second raw material composition, followed by further mixing thereof with the third raw material composition, or by mixing the first raw material composition with the third raw material composition, followed by further mixing thereof with the second raw material composition.

In addition, the step of preparing the raw material mixture may be carried out under the condition of 50° C. to 150° C. If necessary, it may be carried out under vacuum defoaming conditions.

The step of injecting the raw material mixture into a mold and curing it may be carried out under the temperature condition of 60° C. to 120° C. and the pressure condition of 50 kg/m$^2$ to 200 kg/m$^2$.

In addition, the above preparation process may further comprise the steps of cutting the surface of a polishing pad thus obtained, machining grooves on the surface thereof, bonding with the lower part, inspection, packaging, and the like. These steps may be carried out in a conventional manner for preparing a polishing pad.

Polishing Pad

The polishing pad according to one embodiment comprises a cured product of the composition according to the embodiment and a plurality of micropores dispersed in the cured product.

That is, the polishing pad according to one embodiment comprises a polyurethane resin and a plurality of micropores dispersed in the polyurethane resin, wherein the polyurethane resin is derived from a urethane-based prepolymer, and the urethane-based prepolymer comprises a first oligomer represented by the following Formula 1 in which n is 0 or 1; and a second oligomer represented by the following Formula 1 in which n is 2 or 3.

[Formula 1]

The polishing pad is comprised of a polyurethane resin, and the polyurethane resin may comprise a cured product (i.e., polymer) of a urethane-based prepolymer having an isocyanate terminal group. The weight average molecular weight (Mw) of the polyurethane resin may be 500 g/mole to 1,000,000 g/mole, 5,000 g/mole to 1,000,000 g/mole, 50,000 g/mole to 1,000,000 g/mole, 100,000 g/mole to 700,000 g/mole, or 500 g/mole to 3,000 g/mole.

The thickness of the polishing layer may be 0.8 mm to 5.0 mm, 1.0 mm to 4.0 mm, 1.0 mm to 3.0 mm, 1.5 mm to 2.5 mm, 1.7 mm to 2.3 mm, or 2.0 mm to 2.1 mm. Within the above range, the basic physical properties as a polishing pad can be sufficiently exhibited while the particle size variation between the upper and lower portions is minimized.

The specific gravity of the polishing pad may be 0.6 g/cm$^3$ to 0.9 g/cm$^3$ or 0.7 g/cm$^3$ to 0.85 g/cm$^3$.

In addition, the polishing pad may have the same physical properties and pore characteristics as those of the composition according to the above embodiment upon curing in addition to the physical properties exemplified above.

The hardness of the polishing pad may be 30 Shore D to 80 Shore D, 40 Shore D to 70 Shore D, 50 Shore D to 70 Shore D, 40 Shore D to 60 Shore D, or 50 Shore D to 60 Shore D.

The tensile strength of the polishing pad may be 5 N/mm$^2$ to 30 N/mm$^2$, 10 N/mm$^2$ to 25 N/mm$^2$, 10 N/mm$^2$ to 20 N/mm$^2$, or 15 N/mm$^2$ to 30 N/mm$^2$.

The elongation of the polishing pad may be 50% to 300%, 100% to 300%, 150% to 250%, or 100% to 200%.

The micropores are present as dispersed in the polyurethane resin.

The average size of the micropores may be 10 μm to 50 μm, 20 μm to 50 μm, 20 μm to 40 μm, 20 μm to 30 μm, or 30 μm to 50 μm. As a specific example, the micropores may have an average size of 21 μm to 25 μm.

In addition, 100 to 300, 150 to 300, or 100 to 250 of the micropores may be contained per an area of 0.3 cm$^2$ of the polishing pad.

In addition, the total area of the micropores may be 30% to 60%, 35% to 50%, or 35% to 43% based on the total area of the polishing pad.

In addition, the micropores may be contained in an amount of 30 to 70% by volume, or 40 to 60% by volume based on the total volume of the polishing pad.

The polishing rate (or removal rate) of the polishing pad may be 3,000 Å/50 seconds to 5,000 Å/50 seconds, 3,000 Å/50 seconds to 4,000 Å/50 seconds, 4,000 Å/50 seconds to 5,000 Å/50 seconds, or 3,500 Å/50 seconds to 4,500 Å/50 seconds. As a specific example, the polishing pad may have a polishing rate (or removal rate) of 3,500 Å/50 seconds to 3,900 Å/50 seconds. The polishing rate may be an initial polishing rate immediately after the curing of the polishing pad (i.e., immediately after the preparation thereof). If the initial polishing rate is within the above preferred range, it is advantageous to suppressing the pad glazing phenomenon, thereby maintaining an appropriate level of excellent polishing rate in subsequent polishing processes repeatedly carried out.

In addition, the pad cut rate of the polishing pad may be 30 μm/hr to 60 μm/hr, 30 μm/hr to 50 μm/hr, 40 μm/hr to 60 μm/hr, or 40 μm/hr to 50 μm/hr.

The polishing pad may have grooves on its surface for mechanical polishing. The grooves may have a depth, a width, and a spacing as desired for mechanical polishing, which are not particularly limited.

The polishing pad according to another embodiment may comprise an upper pad and a lower pad, wherein the upper pad may have the same composition and physical properties as those of the polishing pad according to the embodiment.

The lower pad serves to support the upper pad and to absorb and disperse an impact applied to the upper pad. The lower pad may comprise a nonwoven fabric or a suede.

In addition, an adhesive layer may be interposed between the upper pad and the lower pad.

The adhesive layer may comprise a hot melt adhesive. The hot melt adhesive may be at least one selected from the group consisting of a polyurethane resin, a polyester resin, an ethylene-vinyl acetate resin, a polyamide resin, and a polyolefin resin. Specifically, the hot melt adhesive may be at least one selected from the group consisting of a polyurethane resin and a polyester resin.

Process for Preparing a Semiconductor Device

The process for preparing a semiconductor device according to one embodiment comprises polishing the surface of a semiconductor substrate using the polishing pad according to the embodiment.

That is, the process for preparing a semiconductor device according to one embodiment comprises polishing the surface of a semiconductor substrate using a polishing pad, wherein the polishing pad comprises a polyurethane resin and a plurality of micropores dispersed in the polyurethane resin, the polyurethane resin is derived from a urethane-based prepolymer, and the urethane-based prepolymer comprises a first oligomer represented by the following Formula 1 in which n is 0 or 1; and a second oligomer represented by the following Formula 1 in which n is 2 or 3.

[Formula 1]

Specifically, once the polishing pad according to the embodiment is attached to a platen, a semiconductor substrate is disposed on the polishing pad. In such event, the surface of the semiconductor substrate is in direct contact with the polishing surface of the polishing pad. A polishing slurry may be sprayed on the polishing pad for polishing. Thereafter, the semiconductor substrate and the polishing pad rotate relatively to each other, so that the surface of the semiconductor substrate is polished.

The polishing pad according to the embodiment has excellent elongation, hardness, micropore characteristics, polishing rate, and the like since it is obtained by curing a urethane-based prepolymer having a controlled composition. Thus, it is possible to effectively manufacture a semiconductor device of high quality by using the polishing pad.

MODE FOR THE INVENTION

Hereinafter, the present invention is explained in detail by the following Examples. However, the scope of the present invention is not limited thereto.

EXAMPLES AND COMPARATIVE EXAMPLE

A 4-necked flask was charged with toluene 2,4-diisocyanate (2,4-TDI), toluene 2,6-diisocyanate (2,6-TDI), polytetramethylene ether glycol (PTMEG), and dicyclohexylmethane diisocyanate (H12MDI), which were reacted at 80° C., followed by further addition of diethylene glycol (DEG) and further reaction at 80° C., which was purified to prepare reactants of various molecular weights and a urethane-based prepolymer comprising the same.

A casting machine equipped with tanks and feeding lines for a prepolymer, a curing agent, an inert gas, and a foaming agent was provided. The urethane-based prepolymer prepared above, a curing agent (bis(4-amino-3-chlorophenyl) methane, Ishihara), an inert gas ($N_2$), a liquid phase foaming agent (FC3283, 3M), a solid phase foaming agent (Akzonobel), and a silicone-based surfactant (Evonik) were charged to each tank. The raw materials were stirred while they were fed to the mixing head at constant rates through the respective feeding lines. In such event, the prepolymer and the curing agent were fed at an equivalent ratio of 1:1 and at a total rate of 10 kg/min.

The mixed raw materials were injected into a mold (1,000 mm×1,000 mm×3 mm) and reacted to obtain a molded article in the form of a solid cake. Thereafter, the top and bottom of the molded article were each cut by a thickness of 0.5 mm to obtain a top pad having a thickness of 2 mm.

Thereafter, the upper pad was subjected to surface milling and groove forming steps and laminated with a lower pad by hot melt adhesive.

Specific process conditions for preparing the upper pad are summarized in the table below.

TABLE 1

| | Item | Ex. 1 | Ex. 2 | C. Ex. 1 |
|---|---|---|---|---|
| Upper pad | Content of unreacted NCO group in prepolymer | 9.2% by weight | 8.0% by weight | 15% by weight |
| | Casting mold | Single layer | Single layer | Single layer |
| | Sheet machining (casting, cutting, and grooving) | sequential | sequential | sequential |
| | Prepolymer (part by weight) | 100 | 100 | 100 |
| | Surfactant (part by weight) | 0.2 to 1.5 | 0.2 to 1.5 | 0.2 to 1.5 |
| | Solid phase foaming agent (part by weight) | 0.5 to 1.0 | 0.5 to 1.0 | 0.5 to 1.0 |
| | Inert gas feeding rate (l/min) | 0.5 to 1.5 | 0.5 to 1.5 | 0.5 to 1.5 |

Test Example

The urethane-based prepolymers or polishing pads obtained in the Examples and Comparative Example were tested for the following items. The results are shown in Table 2.

(1) MALDI Analysis of a Prepolymer

Figure 1:
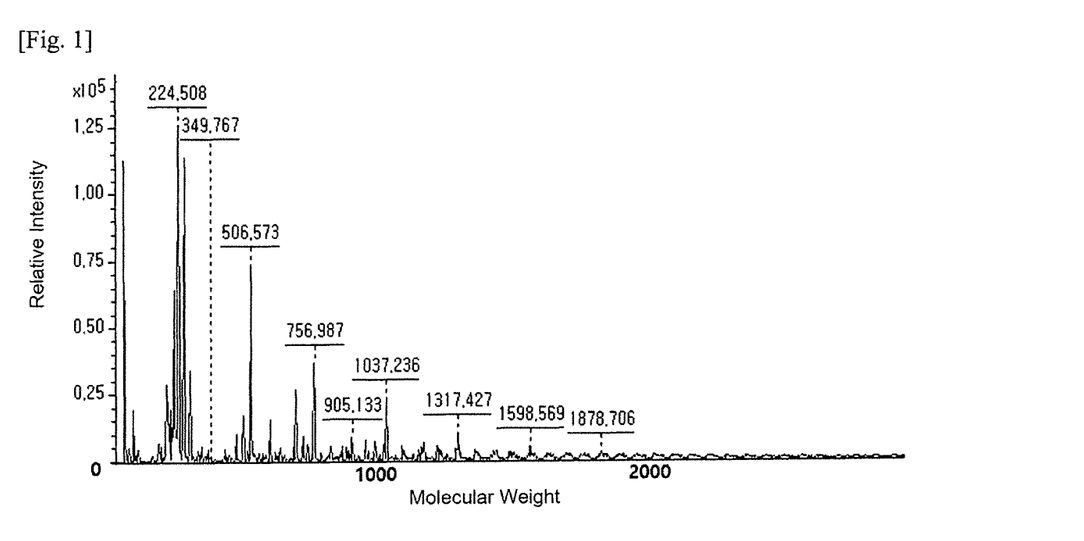
FIGS. 1, 2, and 3 show the results of carrying out the matrix-assisted laser desorption/ionization (MALDI) analysis of the urethane-based prepolymers prepared in Examples 1 and 2 and Comparative Example 1, respectively.
Figure 2:
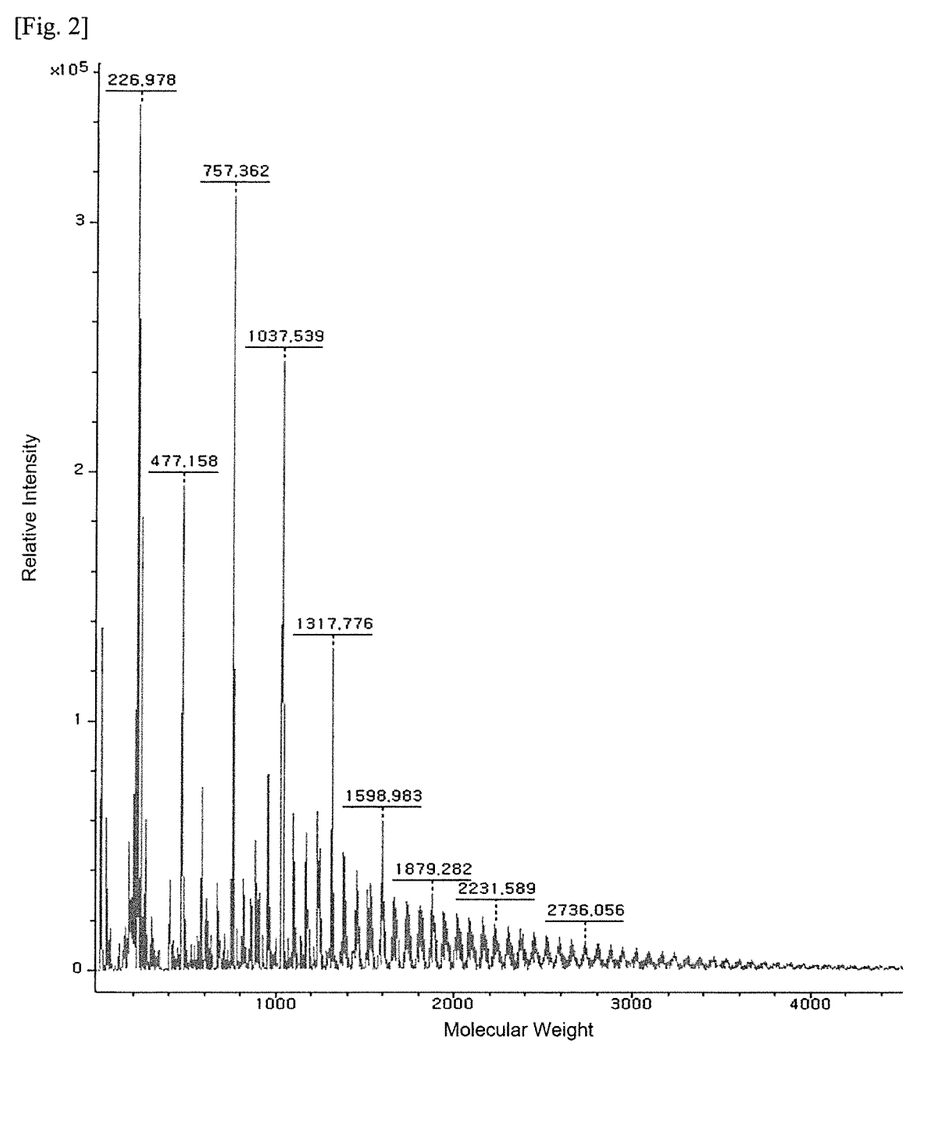
Figure 3:
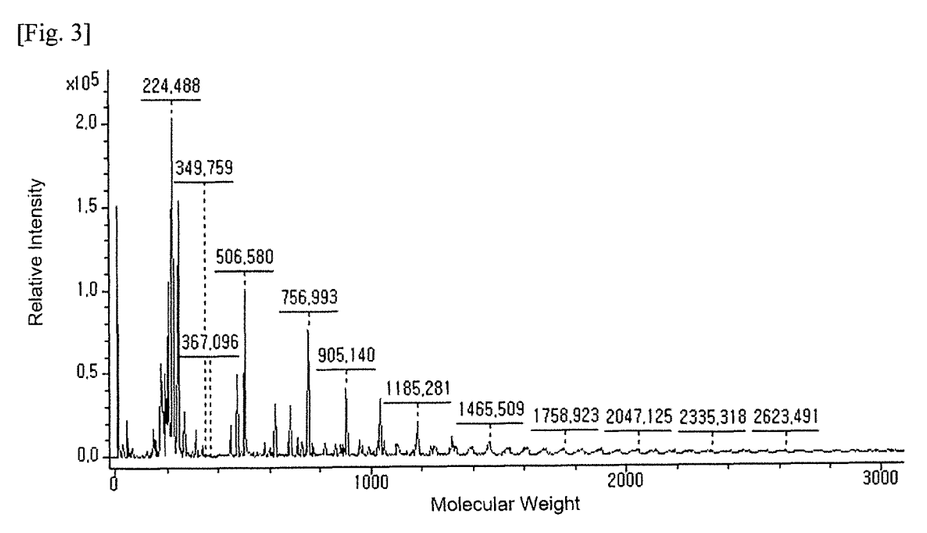

The prepolymer samples were each dissolved in tetrahydrofuran (THF) and mixed with a matrix and a salt, which was analyzed using an instrument (UltrafleXtreme) for measuring matrix-assisted laser desorption/ionization (MALDI). The results of Examples 1 and 2 are shown in FIGS. 1 and 2, and the results of Comparative Example 1 are shown in FIG. 3.

The results of MALDI analysis showed peaks of various molecular weights, including the oligomers of Formula 1, the reactants of TDI and PTMEG, or the components added for the MALDI analysis. The intensity of the peak was irrelevant to the content of the corresponding molecular weight component. The molecular weight values of the peaks measured in MALDI are largely the molecular weights of those combined with the $Na^+$ ions used as a salt in the MALDI analysis.

As shown in Table 2 below, in the MALDI data of Example 1, the molecular weight peaks of species in which $Na^+$ ions are combined to the oligomers represented by Formula 1 in which n is 0 to 3 were observed.

TABLE 2

| n value | 0 | 1 | 2 | 3 |
|---|---|---|---|---|
| Ex. 1 | 477.141 | 756.987 | 1037.236 | 1317.427 |

In addition, as shown in Table 3 below, in the MALDI data of Example 2, the molecular weight peaks of species in which $Na^+$ ions are combined to the oligomers represented by Formula 1 in which n is 0 to 6 were observed.

TABLE 3

| n value | 0 | 1 | 2 | 3 | 4 | 5 | 6 |
|---|---|---|---|---|---|---|---|
| Ex. 2 | 477.158 | 757.362 | 1037.539 | 1317.776 | 1598.983 | 1879.282 | 2159.376 |

In addition, as shown in Table 4 below, in the MALDI data of Comparative Example 1, the molecular weight peaks of species in which $Na^+$ ions are combined to the oligomers represented by Formula 1 in which n is 0 or 1 were observed.

TABLE 4

| n value | 0 | 1 |
|---|---|---|
| C. Ex. 1 | 477.141 | 756.993 |

(2) NMR Analysis of a Prepolymer 5 mg of a prepolymer sample was dissolved in $CDCl_3$ and subjected to $^1H$-NMR and $^{13}C$-NMR analyses using a nuclear magnetic resonance (NMR) device (JEOL 500 MHz, 90° pulse) at room temperature. The peaks of reacted or unreacted methyl groups of TDI in the NMR data thus obtained were integrated, whereby the content of a reacted or unreacted aromatic diisocyanate monomer in the prepolymer was calculated.

Specifically, when the weight of 2,4-TDI (hereinafter referred to as "4-reacted 2,4-TDI") in which only the NCO group located at the 4-position among the two NCO groups had been reacted with a polyol is 100 parts by weight, the respective weights of 2,4-TDI (hereinafter referred to as "2,4-reacted 2,4-TDI") in which both NCO groups had been reacted with a polyol to form a chain, 2,6-TDI (hereinafter referred to as "unreacted 2,6-TDI") in which no NCO group had been reacted with a polyol, and 2,4-TDI (hereinafter referred to as "2-reacted 2,4-TDI") in which only NCO group located at the 2-position or the 6-position of the two NCO groups had been reacted with a polyol were calculated. (In addition, 2,4-TDI in which the NCO group located at the 2-position had been reacted and 2,6-TDI in which both NCO groups had been reacted were hardly detected.)

The results are shown in the table below.

TABLE 5

| | Item | Ex. 1 | Ex. 2 | C. Ex. 1 |
|---|---|---|---|---|
| Content (parts by weight) | 4-reacted 2,4-TDI | 100.00 | 100.00 | 100.00 |
| | 2,4-reacted 2,4-TDI | 36.63 | 49.65 | 13.90 |
| | unreacted 2,6-TDI | 7.83 | 3.65 | 21.22 |
| | 2-reacted 2,6-TDI | 21.67 | 26.17 | 9.59 |
| | Total content of TDI | 166.13 | 179.47 | 144.71 |

TABLE 6

| | Item | Ex. 1 | Ex. 2 | C. Ex. 1 |
|---|---|---|---|---|
| Content (% by weight) (Total TDI weight) | Unreacted TDI | 4.71 | 2.03 | 14.66 |
| | TDI with two reacted NCO groups (c1) | 22.05 | 27.66 | 9.61 |
| | TDI with one reacted NCO group (c2) | 73.24 | 70.30 | 75.73 |
| | TDI with at least one reacted NCO group | 95.29 | 97.97 | 85.34 |
| | c1/c2 weight ratio | 0.30 | 0.39 | 0.13 |

TABLE 7

| | Item | Example 1 | Ex. 2 | C. Ex. 1 |
|---|---|---|---|---|
| Content (% by weight) (Urethane-based prepolymer weight) | Unreacted TDI (c3) | 1.46 | 0.68 | 6.78 |
| | Unreacted H12MDI (c4) | 7.60 | 7.60 | 7.60 |
| | c3 + c4 | 9.06 | 8.28 | 13.88 |
| | c3/c4 weight ratio | 0.19 | 0.09 | 0.83 |

(3) Hardness

Each sample was cut to 5 cm×5 cm (thickness: 2 mm) and stored at a temperature of 25° C. for 12 hours to measure the Shore D hardness and Asker C hardness using a hardness tester.

(4) Specific Gravity

Each sample was cut to 5 cm×5 cm (thickness: 2 mm) and stored at a temperature of 25° C. for 12 hours to measure the specific gravity using a gravimeter.

(5) Tensile Strength

Each sample was cut to 4 cm×1 cm (thickness: 2 mm). The ultimate strength immediately before the fracture was measured while the polishing pad was tested at a rate of 50 mm/min using a universal testing machine (UTM).

(6) Elongation

Each sample was cut to 4 cm×1 cm (thickness: 2 mm). The maximum deformation immediately before the fracture was measured while the polishing pad was tested at a rate of 50 mm/min using a universal testing machine (UTM) The ratio of the maximum deformation to the initial length was expressed in percent (%).

(7) Gelation Time

The prepolymer and the curing agent were mixed at an equivalent ratio of 1:1, and the time taken until the mixture stirred at 5,000 rpm was gelated at 70° C. was measured.

The results are shown in the table below.

TABLE 8

| Item | Evaluation | Ex. 1 | Ex. 2 | C. Ex. 1 |
|---|---|---|---|---|
| Upper pad | Thickness (mm) | 2 | 2 | 2 |
| | Hardness (Shore D) | 60 | 52 | 68 |
| | Specific gravity (g/cc) | 0.8 | 0.8 | 0.8 |
| | Tensile strength (N/mm$^2$) | 21 | 18 | 25 |
| | Elongation (%) | 125 | 200 | 63 |
| | Gelation time (s) | 108 | 121 | 50 |
| Lower pad | Type | Nonwoven fabric | Nonwoven fabric | Nonwoven fabric |
| | Thickness (mm) | 1.1 | 1.1 | 1.1 |
| | Hardness (Asker C) | 70 | 70 | 70 |
| Laminated pad | Thickness (mm) | 3.32 | 3.32 | 3.32 |
| | Compression rate (%) | 1.05 | 1.05 | 1.05 |

(8) Pore Characteristics

Figure 4A:
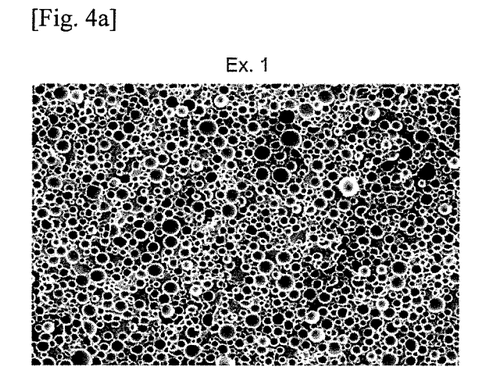
FIGS. 4a, 4b, and 4c are scanning electron microscope (SEM) images of pores in the polishing pads obtained by curing the compositions of Examples 1 and 2 and Comparative Example 1, respectively.
Figure 4B:
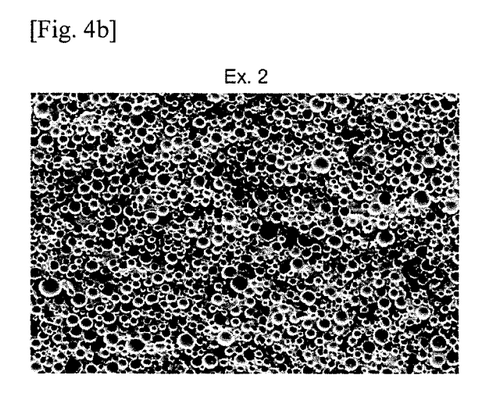
Figure 4C:
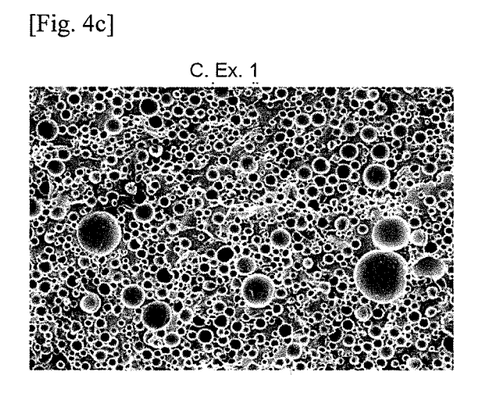

The pores of each polishing pad were observed by scanning electron microscopy (SEM) and are shown in FIGS. 4a to 4c. As shown in FIGS. 4a to 4c, the pores in the polishing pads of Examples 1 and 2 are finely and uniformly distributed over a large area.

In addition, the pore characteristics of the pores were calculated based on the SEM images and summarized in the table below.

Number average diameter: average of the sum of the pore diameters divided by the number of pores on the SEM image Number of pores: Number of pores per 0.3 $cm^2$ on the SEM image Pore area ratio: percentage of the area of the pores relative to the total area of the SEM image

[FIG. 9]

| Item | Ex. 1 | Ex. 2 | C. Ex. 1 |
| --- | --- | --- | --- |
| Number average diameter (μm) | 22.454 | 23.313 | 20.523 |
| Number of pores (per 0.3 $cm^2$) | 176 | 167 | 162 |
| Pore area ratio (%) | 38.165 | 38.896 | 38.245 |

(9) Polishing Rate (or Removal Rate)

The initial polishing rate immediately after the polishing pad had been prepared was measured as follows.

A silicon-based semiconductor substrate having a diameter of 300 mm was deposited with silicon oxide by a CVD process. The polishing pad was mounted on a CMP machine, and the semiconductor substrate was set with the silicon oxide layer thereof facing the polishing surface of the polishing pad. The silicon oxide layer was polished under a polishing load of 4.0 psi while it was rotated at a speed of 150 rpm for 60 seconds and a calcined silica slurry was supplied onto the polishing pad at a rate of 250 ml/min. Upon completion of the polishing, the semiconductor substrate was detached from the carrier, mounted in a spin dryer, washed with distilled water, and then dried with nitrogen for 15 seconds. The changes in the film thickness of the dried semiconductor substrate before and after the polishing were measured using a spectral reflectometer type thickness measuring instrument (SI-F80R, Kyence). The polishing rate was calculated using the following Equation. The results are shown in FIG. 5.

Removal rate (Å/50 seconds)=difference in thickness before and after polishing (Å)/polishing time (50 seconds)

Figure 5:
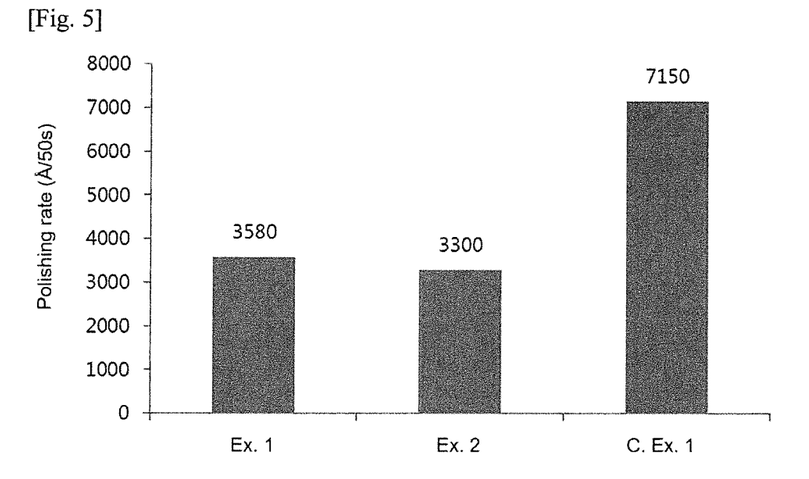
FIG. 5 shows the polishing rates (or removal rates) of the polishing pads of Examples 1 and 2 and Comparative Example 1.

As shown in FIG. 5, the polishing pads of Examples 1 and 2 were excellent in the initial polishing rate at an appropriate level, whereas the polishing pad of Comparative Example 1 had an excessively high initial polishing rate due to the increase in the aggregation of hard segments. Thus, the polishing pad of Comparative Example 1 is expected to sharply decrease in the polishing rate due to the pad glazing phenomenon.

(10) Pad Cut Rate

Each polishing pad was pre-conditioned with deionized water for 10 minutes and then conditioned with deionized water for 1 hour. The change in thickness of the polishing pad during the conditioning was measured to calculate the pad cut rate. The equipment used for conditioning was CTS AP-300HM. The conditioning pressure was 6 lbf, the rotational speed was 100 to 110 rpm, and the disk used for conditioning was Sasol LPX-DS2. The results are shown in FIG. 6.

Figure 6:
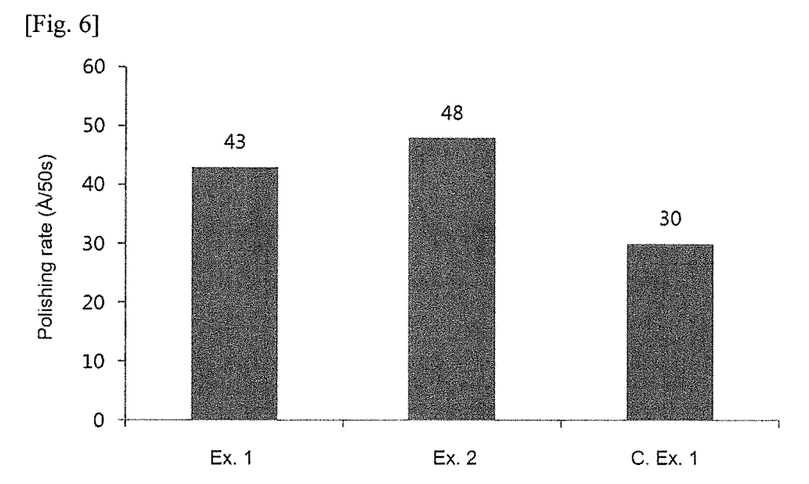
FIG. 6 shows the pad cut rates of the polishing pads of Examples 1 and 2 and Comparative Example 1.

As shown in FIG. 6, the polishing pads of Examples 1 and 2 had an excellent pad cut rate at the time of conditioning with a diamond disk, whereas the polishing pad of Comparative Example 1 had a low pad cut rate due to the increase in the aggregation of hard segments.

The invention claimed is:

1. A composition, which comprises:
a urethane-based prepolymer, a curing agent, and a foaming agent,
wherein the urethane-based prepolymer comprises a first oligomer represented by the following Formula 1 in which n is 0 or 1; and a second oligomer represented by the following Formula 1 in which n is 2 or 3

[Formula 1]

2. The composition of claim 1, wherein the urethane-based prepolymer comprises the first oligomer and the second oligomer at a weight ratio of 1:0.2 to 1:5.

3. The composition of claim 1, wherein the urethane-based prepolymer further comprises a third oligomer represented by the above Formula 1 in which n is an integer of 4 to 6.

4. The composition of claim 3, wherein the urethane-based prepolymer comprises the first oligomer, the second oligomer, and the third oligomer at a weight ratio of 1:0.2:0.1 to 1:5:10.

5. The composition of claim 1, wherein the urethane-based prepolymer further comprises a compound represented by the following Formula 2:

[Formula 2]

in the above formula, p is an integer of 5 to 30.

6. The composition of claim 1, wherein the urethane-based prepolymer comprises an unreacted NCO group in an amount of 7% by weight to 10% by weight based on the weight of the urethane-based prepolymer.

7. The composition of claim 1, wherein the urethane-based prepolymer comprises an unreacted aromatic diisocyanate monomer in an amount of 0.1% by weight to 3% by weight based on the weight of the urethane-based prepolymer.

8. The composition of claim 1, which has a gelation time of 80 seconds to 130 seconds and has, upon curing, a tensile strength of 10 N/mm² to 23 N/mm², an elongation of 80% to 250%, and a hardness of 40 Shore D to 65 Shore D.

9. A process for preparing a composition, which comprises:
preparing a first oligomer represented by the following Formula 1 in which n is 0 or 1;
preparing a second oligomer represented by the following Formula 1 in which n is 2 or 3;
preparing a urethane-based prepolymer comprising the first oligomer and the second oligomer; and
mixing the urethane-based prepolymer, a curing agent, and a foaming agent

[Formula 1]

10. A process for preparing a polishing pad, which comprises injecting the composition of claim 1 into a mold and curing the composition.

11. A polishing pad, which comprises a polyurethane resin and a plurality of micropores dispersed in the polyurethane resin,
wherein the polyurethane resin is derived from a urethane-based prepolymer, and the urethane-based prepolymer comprises a first oligomer represented by the following Formula 1 in which n is 0 or 1; and a second oligomer represented by the following Formula 1 in which n is 2 or 3.

[Formula 1]

12. The polishing pad of claim 11, wherein the micropores have an average size of 21 μm to 25 μm, and the polishing pad has a polishing rate of 3,500 Å/50 seconds to 3,900 Å/50 seconds.

13. A process for preparing a semiconductor device, which comprises polishing the surface of a semiconductor substrate using the polishing pad of claim 11.

* * * * *